United States Patent [19]
Aoki et al.

[11] Patent Number: 5,840,615
[45] Date of Patent: Nov. 24, 1998

[54] METHOD FOR FORMING A FERROELECTRIC MATERIAL FILM BY THE SOL-GEL METHOD, ALONG WITH A PROCESS FOR A PRODUCTION OF A CAPACITOR AND ITS RAW MATERIAL SOLUTION

[75] Inventors: Katsuhiro Aoki, Tsukuba; Yukio Fukuda, Toukai-mura; Akitoshi Nishimura, Tsukuba; Tomomi Nagao, Aikawa-machi; Shinichi Hachiya, Sagamihara, all of Japan

[73] Assignee: Texas Instruments Incorporated, Dallas, Tex.

[21] Appl. No.: 810,201

[22] Filed: Mar. 3, 1997

Related U.S. Application Data

[63] Continuation of Ser. No. 227,930, Apr. 15, 1994, abandoned.

[30] Foreign Application Priority Data

Apr. 16, 1993 [JP] Japan .................................. 5-113973

[51] Int. Cl.⁶ .............................................. H01L 21/8242
[52] U.S. Cl. ...................... 438/396; 438/781; 438/785; 427/419.5
[58] Field of Search .................. 437/60, 919; 427/126.2, 427/226, 404, 419.1, 419.2, 419.3, 419.5, 419.8; 438/396, 780, 781, 783, 784, 785

[56] References Cited

U.S. PATENT DOCUMENTS

| | | | |
|---|---|---|---|
| 4,937,208 | 6/1990 | Yamamoto | 501/12 |
| 4,960,618 | 10/1990 | Tanisu et al. | 427/226 |
| 4,963,390 | 10/1990 | Lipeles et al. | 427/126.2 |
| 5,122,477 | 6/1992 | Wolters et al. | 437/60 |
| 5,244,691 | 9/1993 | Valente et al. | 427/126.2 |
| 5,391,393 | 2/1995 | Maniar | 427/126.2 |

FOREIGN PATENT DOCUMENTS

| | | |
|---|---|---|
| 431 999 A1 | 11/1990 | European Pat. Off. . |
| 489 519 A2 | 11/1991 | European Pat. Off. . |
| 61-97159 | 5/1986 | Japan . |
| 0383817 | 4/1991 | Japan . |
| 3-93107 | 4/1991 | Japan . |
| 4-139064 | 5/1992 | Japan . |
| 5-298920 | 11/1993 | Japan . |

OTHER PUBLICATIONS

N. Tohge, et al., J. Am. Ceram. Soc., 74(1) (1991) 67, "Preparation of PbZrO3–PbTiO3 Ferroelectric Thin Films by the Sol–Gel Process".

Translation of JP 3–83817, Apr. 1991.

Miyazawa et al., "Microstructural Characterization of Gel–Derived Thin Films" Ceram. Trans. (1993) 30 (Nucleation & Crystallization in Liquids) pp. 331–334.

*Primary Examiner*—Charles L. Bowers, Jr.
*Assistant Examiner*—Leon Radomsky
*Attorney, Agent, or Firm*—William B. Kempler; Richard L. Donaldson

[57] ABSTRACT

A method for forming a ferroelectric material film, more particularly a lead zirconate titanate (PZT) film by the sol-gel method wherein a lowered oxidative sintering temperature may be adopted in preparing the ferroelectric material film with a perovskite crystalline structure, thereby reducing the risk of oxidation of metal electrodes and other circuits when the ferroelectric material film is employed as a dielectric in semiconductor devices, such as in a capacitor, for example. The method contemplates the preparation of a raw material solution containing an organometallic compound of a metallic element forming the ferroelectric material film, alkanolamine and/or stabilizer comprising a β-diketone, with the concentration of the stabilizer being sufficient to provide a mole ratio to the total metal atoms of (stabilizer/total metal atoms)>3. The method then involves coating the raw material solution, drying the coated raw material solution to form a dried film, and sintering the dried film to form the ferroelectric material film wherein the oxidative sintering is carried out at a relatively low temperature of about 450° C. in forming the ferroelectric material film with a perovskite crystalline structure.

9 Claims, 5 Drawing Sheets

METHOD FOR FORMING A FERROELECTRIC MATERIAL FILM BY THE SOL-GEL METHOD, ALONG WITH A PROCESS FOR A PRODUCTION OF A CAPACITOR AND ITS RAW MATERIAL SOLUTION

This application is a Continuation of application Ser. No. 08/227,930, filed Apr. 15, 1994, abandoned.

This invention pertains to a method for forming a ferroelectric material film (particularly, a lead zirconate titanate (PZT) film) by the sol-gel method, along with a process for the production of a capacitor (particularly a capacitor for a semiconductor memory cell) and its raw material solution.

BACKGROUND OF THE INVENTION

For example, as an insulation film (dielectric film) for a capacitor of a memory cell of a dynamic RAM, an ONO film having a structure with $SiO_2$, $Si_3N_4$, and $SiO_2$ layers laminated in this order is used.

However, the effective specific inductive capacity of this ONO film is about 5, which is small, and in the case of applications to large-capacity memories over 254 Mb, there are significant processing difficulties such as requirements for a low thickness of the capacitor's dielectric film under restrictions with respect to the area, a complex structure needed to expand the area, etc.

On the other hand, in the case of ferroelectric materials with a perovskite crystalline structure, the specific inductive capacity is extremely large, in a range of several hundreds to several thousands; consequently, they are noted as insulation film material for a capacitor of dynamic RAM devices to be used in the future.

To form a film of PZT represented by $Pb(Zr,Ti)O_2$ among those ferroelectric materials, the use of the sol-gel method, which is one of the methods for thin film preparation, has been known previously.

The method for forming a $Pb(Zr,Ti)O_2$ film by the sol-gel method is explained by referring to FIG. 12 as follows.

First of all, in the work unit 1, a sol-gel raw material solution as a precursor is prepared through metal alkoxide hydrolysis and polycondensation. It is coated on a substrate using, for example, the spin coating method or dip coating method in the work unit 2. Subsequently, the coated film is dried at a temperature of 100°–300° C. in the work unit 3 to obtain a sol-gel thin film in its dried gel state (polymer gel).

Subsequently in the work unit 4, the oxidative sintering treatment of the dried film is carried out in a high-temperature oxygen atmosphere at 600° C. or above to complete the process through conversion of the dried gel thin film to a thin film of $Pb(Zr,Ti)O_2$ having a perovskite crystalline structure.

As a sol-gel raw material solution for $Pb(Zr,Ti)O_2$, the previously used solution is one made of $Pb(CH_3COO)_2 \cdot 3H_2O$ (lead acetate), Ti $(i\text{-}OC_3H_7)_4$ (titanium isopropoxide), $Zr(i\text{-}OC_3H_7)_4$ (zirconium isopropoxide) and a stabilizer, $NH(C_2H_4OH)_2$ (diethanolamine, abbreviated as DEA below) diluted with a solvent $CH_3OC_2H_4OH$ (methoxyethanol).

On the other hand, if the capacitor's dielectric thin film is made of $Pb(Zr,Ti)O_2$, there are problems involving oxidation, etc., of the metal electrodes, circuits, etc., on the substrate since such a $Pb(Zr,Ti)O_2$ film itself is formed by carrying out sintering under an oxygen atmosphere.

The oxidative sintering temperature of any of the previously available $Pb(Zr,Ti)O_2$ thin films is high, so the above problems of electrode oxidation, etc., cannot be prevented.

For example, the PZT thin film reported by Suzuki et al. (Nippon Ceramics Kyokai Gakujyutu Ronbunshu, 98 (8) 754–778 (1990)) is prepared by oxidative sintering carried out at a high temperature of 700° C.; furthermore, the PZT thin film reported by Yamamura et al. ("Kyoyudentai Hakumaku Shusekika Gijutu (Ferroelectric material thin film integration technology)", Chapter 3 (Section 4-2)) is prepared by oxidative sintering carried out at 600° C.

Therefore, any of the prior art techniques for preparing $Pb(Zr,Ti)O_2$ thin films with a perovskite crystalline structure by the sol-gel method have been said to require oxidative sintering at a high temperature above 600° C.

It is an object of this invention to provide a method in which a lower temperature may be employed for oxidative sintering required to obtain a perovskite crystalline structure in the formation of ferroelectric material films of $Pb(Zr,Ti)O_2$, etc., by the sol-gel method.

SUMMARY OF THE INVENTION

Specifically, the invention pertains to a method for forming a ferroelectric material film by the sol-gel method comprising:

(a) preparing a raw material solution containing an organometallic compound of a metallic element forming the ferroelectric material film, alkanolamine and/or stabilizer comprising a β-diketone, with the concentration of the stabilizer being that needed to provide the mole ratio to the total metal atoms of (stabilizer/total metal atom)>3;

(b) coating the raw material solution;

(c) drying the coated raw material solution forming a dried film; and (d) sintering the dried film to form a ferroelectric material film.

In accordance with the invention, the relationship between the sol-gel raw material of $Pb(Zr,Ti)O_2$ and the oxidative sintering temperature required to obtain a perovskite crystalline structure was investigated. As a result, it was determined that the oxidative sintering temperature was affected mostly by alkanolamines such as DEA (diethanolamine), etc., and β-diketones such as acetylacetone, etc., among those components forming the sol-gel raw material. Furthermore, a $Pb(Zr,Ti)O_2$ crystalline thin film having satisfactory electrical characteristics could be prepared even in the case of low-temperature sintering of 450° C. by optimizing the concentration in the raw material as described above.

According to the method of this invention, the mole ratio concentration of stabilizers such as DEA, etc., in the raw material solution is set to (stabilizer/total metal atom)>3 compared with a mole ratio of about 2 in the prior art. It was found that when the oxidative sintering was carried out with a relatively high concentration of stabilizers, ferroelectric material films of $Pb(Zr,Ti)O_2$, etc., having a perovskite crystalline structure could be surprisingly prepared at a relatively low temperature of about 450° C.

When the stabilizer concentration is set at $10 \geq (\text{stabilizer}/\text{total metal atom}) \geq 4$, the effects described above can be stably achieved.

In the method of this invention, a ferroelectric material film made of a lead zirconate titanate is specifically prepared by coating a raw material solution comprising a lead fatty acid such as lead acetate represented by $Pb(CH_3COO)_2 \cdot 3H_2O$, etc., titanium alkoxide represented, for example, by $Ti(i\text{-}OC_3H_7)_4$, zirconium alkoxide represented, for example, by $Zr(i\text{-}OC_3H_7)_4$, diethanolamine (DEA), and/or acetylacetone, then drying and carrying out oxidative sintering of the dried film at a temperature in a range of 450°–700° C.

Furthermore, this invention also provides a process for the production of a capacitor having a ferroelectric material film (particularly a capacitor for semiconductor memory devices such as dynamic RAM, etc.) wherein the process comprises: preparing a raw material solution, which contains organometallic compounds of metallic elements forming the ferroelectric material film and a stabilizer having a mole ratio of stabilizer to total metal atoms (stabilizer/total metal atoms)>3, preferably in a range of 10–4; obtaining a ferroelectric material film by coating this raw material solution over a lower electrode, then drying and sintering the dried film prepared; removing any unnecessary portion of this film prepared allowing a required pattern of the ferroelectric material film to remain on the lower electrode; and forming an upper electrode over the ferroelectric material film.

In the production process of this invention, a ferroelectric material film made of lead zirconate titanate is also specifically prepared by coating a raw material solution comprising a lead fatty acid such as lead acetate represented by $Pb(CH_3COO)_2 \cdot 3H_2O$, etc., titanium alkoxide represented, for example, by $Ti(i-OC_3H_7)_4$, zirconium alkoxide represented, for example, by $Zr(i-OC_3H_7)_4$, diethanolamine (DEA), and/or acetylacetone, then drying and carrying out oxidative sintering of the dried film at a temperature of 450°–700° C.

The raw material solution used in the above process of this invention contains organometallic compounds of metallic elements forming the ferroelectric material film and a stabilizer having amole ratio of stabilizer to total metal atoms (stabilizer/total metal atom)>3, preferably in a range of 10–4.

This raw material solution specifically contains lead acetate represented by $Pb(CH_3COO)_2 \cdot 3H_2O$, titanium alkoxide represented, for example, by $Ti(i-OC_3H_7)_4$, zirconium alkoxide represented, for example, by $Zr(i-OC_3H_7)_4$, diethanolamine (DEA), and/or acetylacetone.

Figure 1:
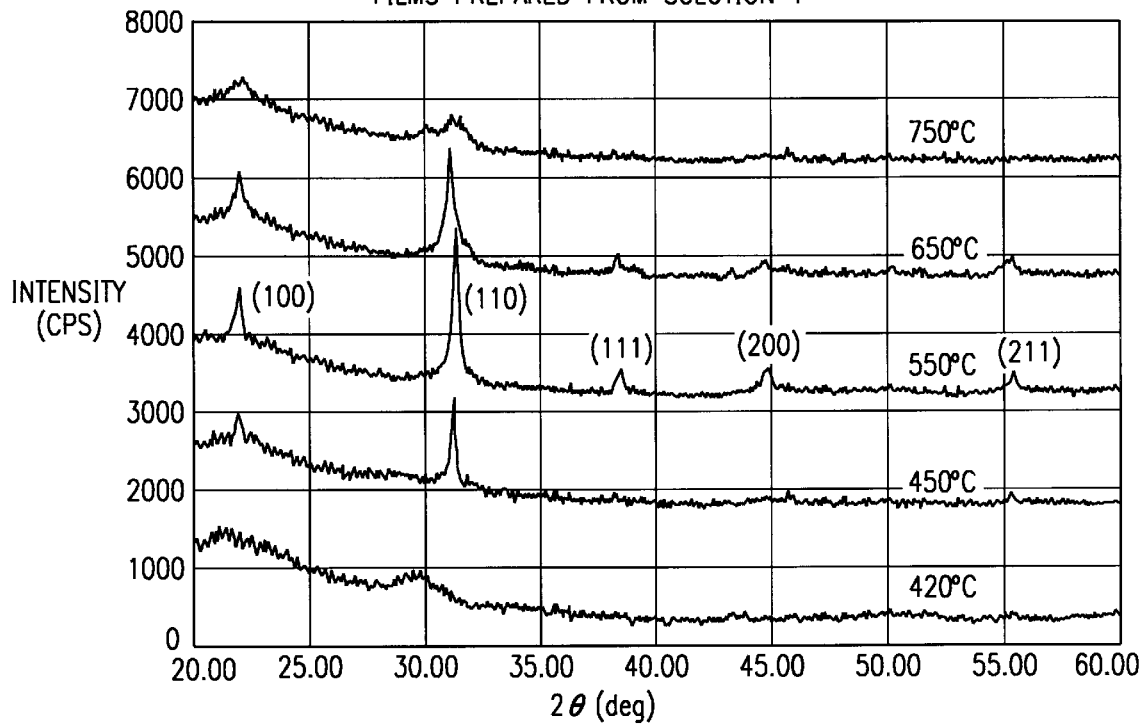
FIG. 1 is an X-ray diffraction pattern for respective sintering temperature settings when the thin films are formed using the sol-gel method and raw material solution of this invention.

Reference numerals as shown in the drawings:
1: silicon substrate
3: N⁺type source region
4: N⁺type drain region
6: lower electrode
7: ferroelectric material film (PZT thin film)
8: upper electrode, CAP: capacitor, TR: transfer gate, M-CEL: memory cell

DESCRIPTION OF PREFERRED EMBODIMENTS

This invention is explained using an embodiment as follows.

First of all, $Pb(CH_3COO)_2 \cdot 3H_2O$, $Ti(i-OC_3H_7)_4$, $Zr(i-OC_3H_7)_4$, and DEA were diluted with $CH_3OC_2H_5OH$ to prepare solution 1 and solution 2, having the compositions shown in the following Table I. Solutions 1 and 2 had different DEA concentrations, which were 1.4 mol/L (mole ratio to the total metal atom content of 7) in solution 1 and 0.2 mol/L (mole ratio to the total metal atom content of 1) in solution 2.

TABLE I

| | Solution composition (unit: mol/L) | |
|---|---|---|
| Compound | Solution 1 | Solution 2 |
| $CH_3COO)_2Pb.3H_2O$ | 0.10 | 0.10 |
| $Zr(i-OC_8H_7)_4$ | 0.05 | 0.05 |
| $Ti(i-OC_8H_7)_4$ | 0.05 | 0.05 |
| $NH(C_2H_4OH)_2$ | 1.40 | 0.20 |
| | (Mole ratio to the total metal atom content of 7) | (Mole ratio to the total metal atom content of 1) |

Figure 12:
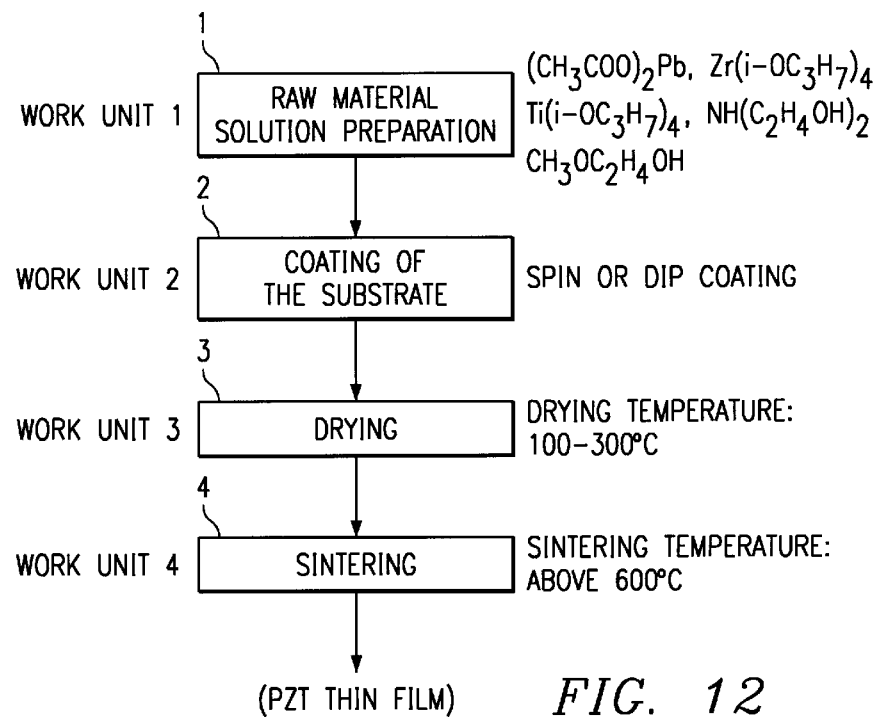
FIG. 12 is a process flow chart for forming a $Pb(Zr,Ti)O_3$ thin film by the sol-gel method.

Work units 2 and 3 shown in FIG. 12 were carried out using solutions 1 and 2 to form 2400-Å-thick dried gel films on a quartz substrate. In this case, the desired thickness was achieved by repeatedly using work units 2 and 3.

Subsequently, the oxidative sintering treatment of the dried gel film prepared from solution 1 was carried out at 420°, 450°, 550°, 650°, or 750° C. for 1 h. On the other hand, the oxidative sintering treatment of the dried gel film of solution 2 was carried out at 550°, 650°, or 750° C. for 1 h. The crystalline states of those samples prepared were examined by X-ray diffraction.

FIG. 1 is an X-ray diffraction pattern of those films prepared from solution 1 according to this invention after oxidative sintering. Accordingly, the thin film prepared by carrying out the oxidative sintering treatment at 420° C. is amorphous, whereas those prepared at a temperature of 450°–650° C. show diffraction patterns of (100) and (200) specific to perovskite crystals, confirming the formation of thin film crystals having perovskite structures.

Figure 2:
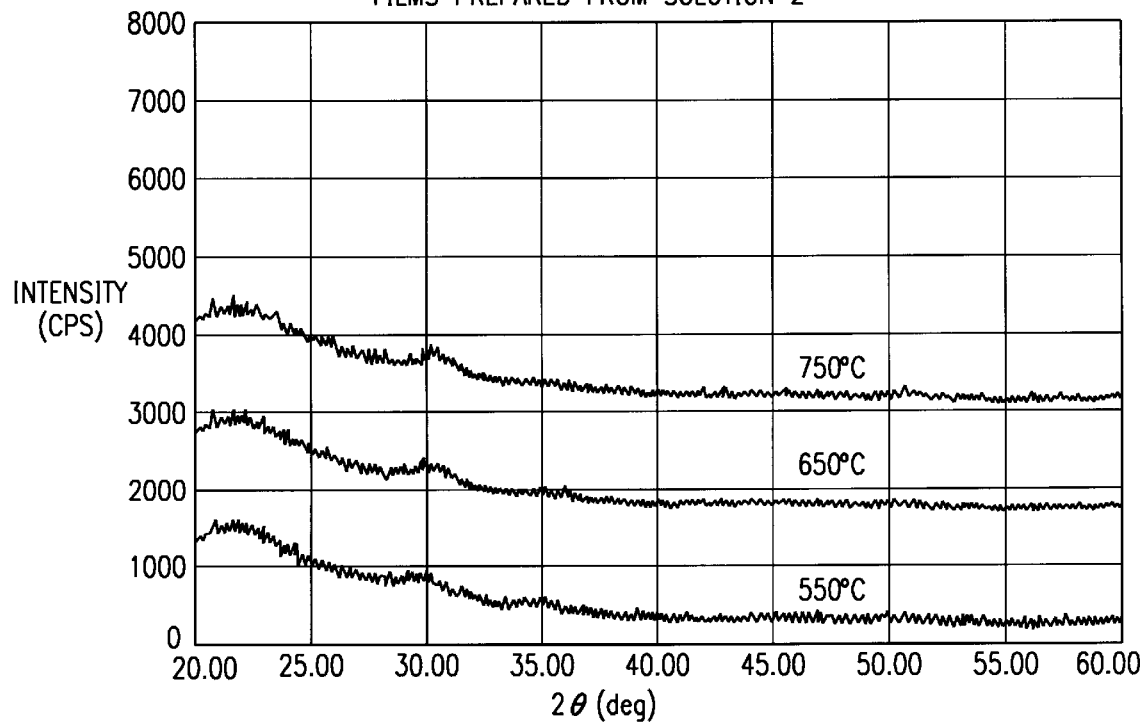
FIG. 2 is an X-ray diffraction pattern for respective sintering temperature settings when the thin films are formed using the sol-gel method and raw material solution in a manner not conforming to this invention.

FIG. 2 is an X-ray diffraction pattern of those films prepared from solution 2 not conforming to this invention after oxidative sintering. As is apparent from the results shown, all of the films prepared from solution 2 show no clear diffraction pattern at any oxidative sintering temperature, and they are amorphous regardless of the oxidative sintering temperature used.

The results described above confirm that the thin films prepared from solution 2 containing DEA at a low concentration of 0.2 mol/L are not crystallized even when the oxidative sintering treatment is carried out at a high temperature of 750° C., whereas the thin films prepared from solution 1 containing DEA at a relatively high concentration of 1.4 mol/L are crystallized to form a perovskite structure even at a low temperature of 450° C.

As described above, the effects of the concentration of DEA used as a basic component of the sol-gel raw material, in the case of $Pb(Zr,Ti)O_2$ ferroelectric material film formation by the sol-gel method, on the crystallization characteristics of PZT were found to be significant.

The same effects as those of the above solution 1 are achievable if the DEA concentration in the raw material is set with (DEA/total metal atom)>3, preferably in a range of 10–4. For example, a crystalline film similar to that obtained from solution 1 was prepared with (DEA/total metal atom) =3.5, confirming the effects of DEA.

Figure 3:
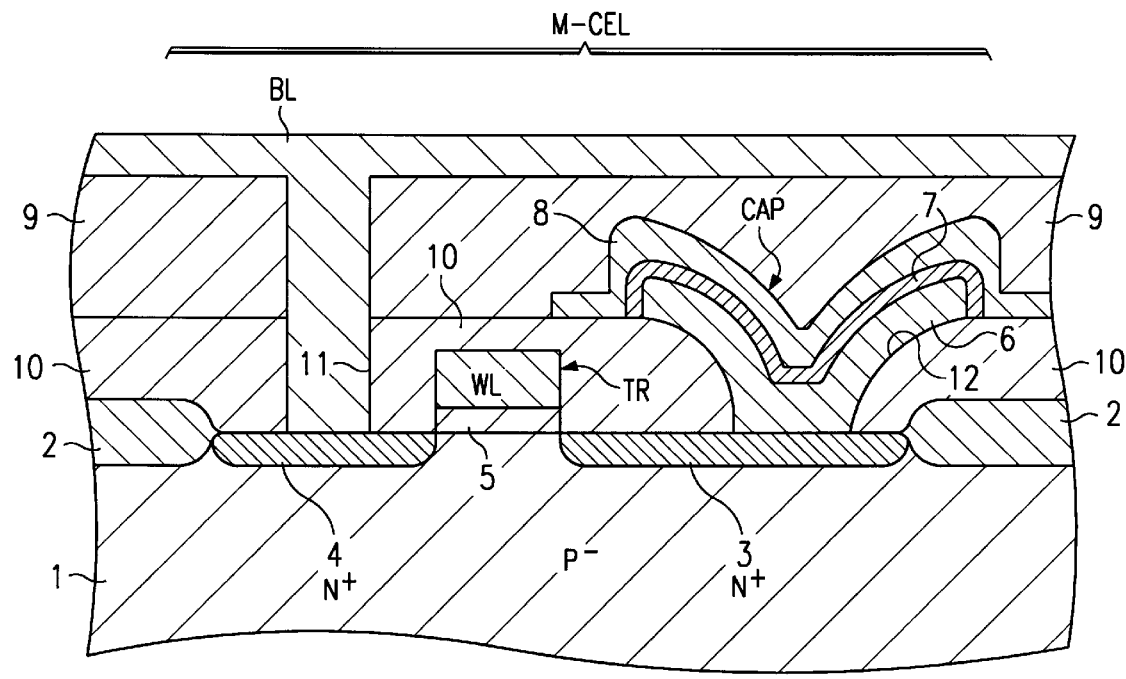
FIG. 3 is an enlarged cross-sectional view of a memory cell of a dynamic RAM taken along line III—III in FIG. 4).
Figure 4:
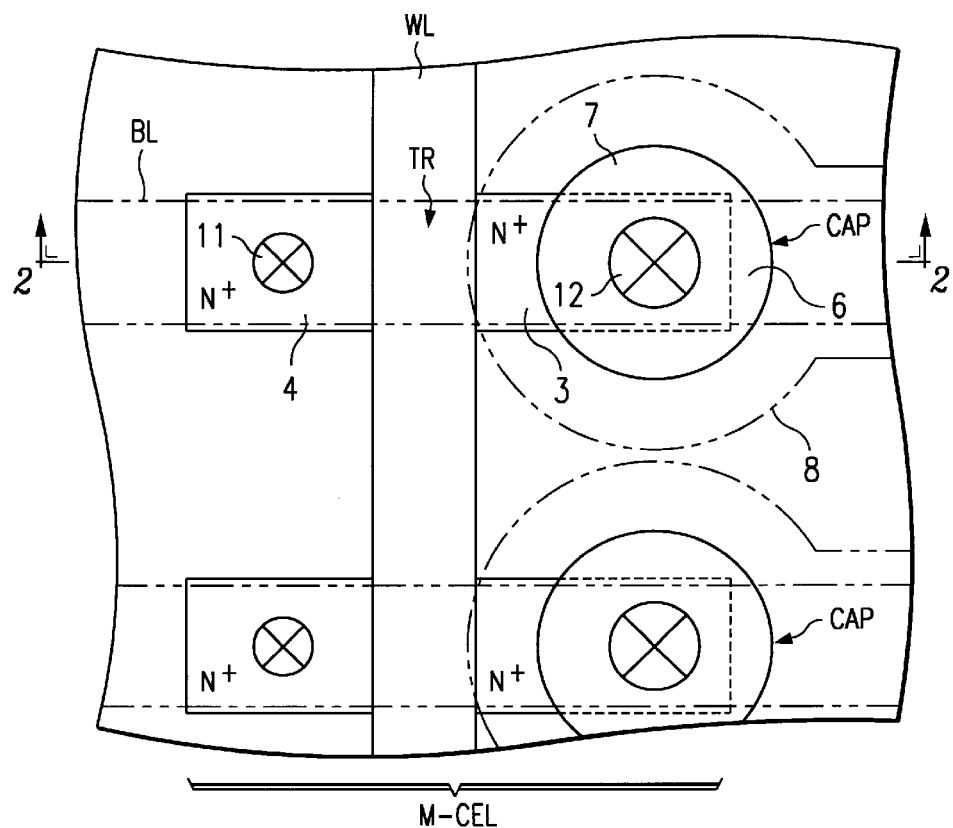
FIG. 4 is an enlarged plan view of the memory cell shown in FIG. 3.

As described above, the use of the raw material solution according to this invention enables sintering crystallization of PZT films at low temperatures (particularly 450°–700° C.), and if such a PZT film is used, for example, in a capacitor (e.g., the stack type) of memory cells of dynamic RAM, it is extremely advantageous. FIG. 3 and FIG. 4 show one example of a dynamic RAM memory cell.

On the main surface of a $P^-$ type silicon substrate 1, field oxide member 2 partitions element regions where a transfer gate TR comprising a MOS transistor and memory cell M-CEL comprising a capacitor CAP are installed.

At the transfer gate TR, $N^+$ source region 3 and $N^+$ drain region 4 are respectively formed by impurity diffusion, between these two regions, a word line WL is installed through a gate oxide film, and to the drain region 4, a bit line BL is connected through a contact hole 11 of insulation layers 9 and 10 made of $SiO_2$, etc.

The capacitor CAP is called a stack type. A lower electrode 6 is connected to the source region 3 through a contact hole 12 of the insulation layer 10, and over this lower electrode, a PZT ferroelectric material film 7 and upper electrode 8 are successively laminated.

The ferroelectric film 7 forming the dielectric of the capacitor CAP is a film made of PZT, that is, $Pb(Zr,Ti)O_2$ formed using the sol-gel method and raw material solution of this invention as described above. Furthermore, the lower electrode 6 comprises a tungsten or titanium nitride layer with Pt, etc., being coated (Pt, etc., not shown in the figures). Furthermore, the upper electrode 8 formed over the ferroelectric film is made of aluminum, Pt, etc.

The process for the preparation of this memory cell M-CEL is explained by referring to FIGS. 5–11 as follows.

Figure 5:
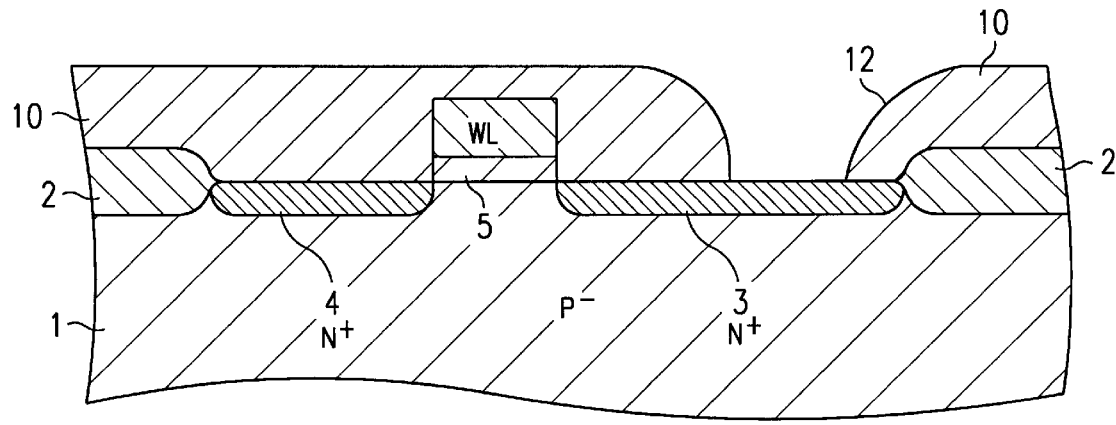
FIG. 5 is an enlarged cross-sectional view showing one stage of a process for the production of the memory cell of FIGS. 3 and 4.

First of all, as shown in FIG. 5, a field oxide film 2 is formed over a $P^-$ type silicon substrate (wafer) by carrying out selective oxidation. The thermal oxidation method is used to form a gate oxide film 5, and the chemical vapor-phase growth method is used to form a polysilicon word line WL. Furthermore, thermal diffusion of an N type impurity such as As is carried out to form $N^+$ type source region 3 and drain region 4, respectively.

Subsequently, an $SiO_2$ insulation layer 10 is formed on the whole surface by the chemical vapor-phase growth method, with a contact hole 12 being formed over the source region 3 by photolithography.

Figure 6:
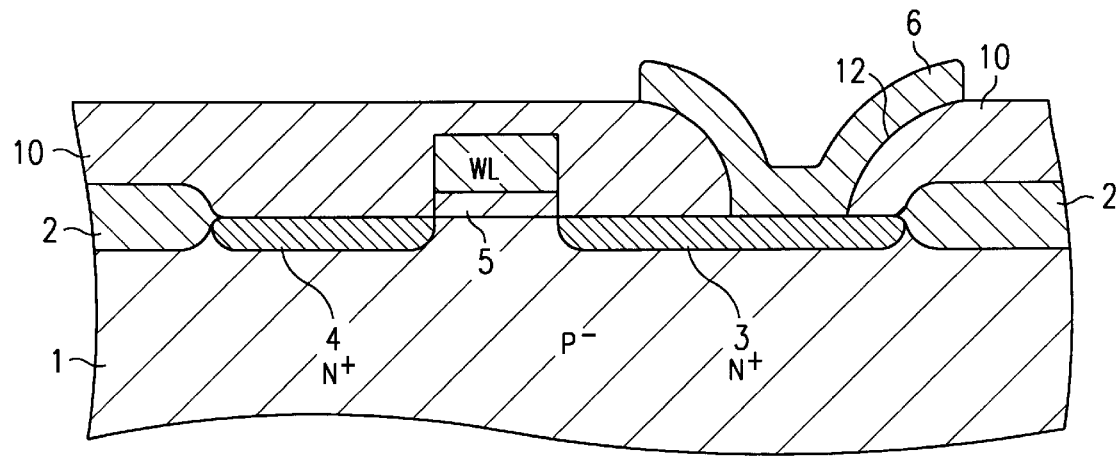
FIG. 6 is an enlarged cross-sectional view showing another stage of the process for the production of the memory cell of FIGS. 3 and 4.

Subsequently, as shown in FIG. 6, a lower electrode 6 having a Pt layer over a tungsten or titanium nitride layer is formed to come into contact with the source region 3 at the contact hole 12. It can be formed by patterning the tungsten or titanium nitride layer and Pt surface layer formed over the whole surface by photolithography.

Figure 7:
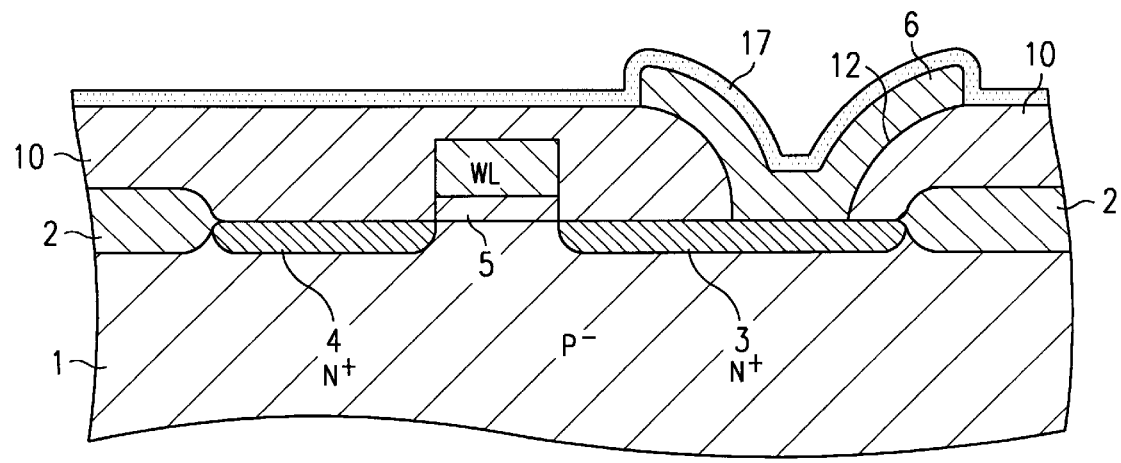
FIG. 7 is an enlarged cross-sectional view showing another stage of the process for the production of the memory cell of FIGS. 3 and 4.

Subsequently, as shown in FIG. 7, a sol-gel raw material solution 17 is coated on the whole surface, including the lower electrode 6, by spin coating or dip coating. This raw material solution 17 has the same composition as solution 1 (see Table I) described above.

Figure 8:
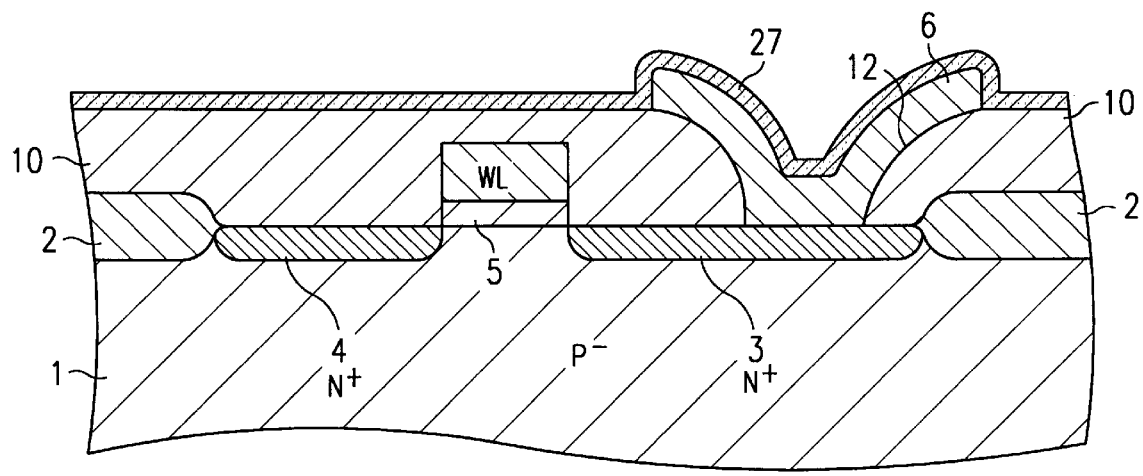
FIG. 8 is an enlarged cross-sectional view showing another stage of the process for the production of the memory cell of FIGS. 3 and 4.

Subsequently, the wafer with the raw material solution 17 coated is heated at a required temperature (100°–300° C.) to dry the coated solution, forming a dried gel film 27 as shown in FIG. 8.

Figure 9:
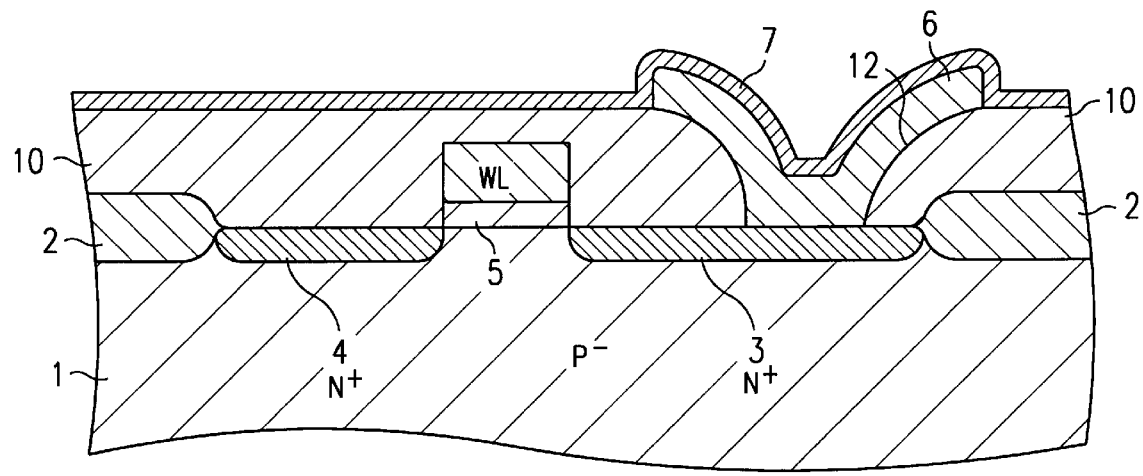
FIG. 9 is an enlarged cross-sectional view showing another stage of the process for the production of the memory cell of FIGS. 3 and 4.

Subsequently, the wafer after drying is treated for oxidative sintering at a temperature (450°–700° C.) sufficient to form a perovskite crystalline structure forming a ferroelectric material film 7 on the whole surface as shown in FIG. 9.

Incidentally, to form the ferroelectric material film 7 at a desired thickness (for example, 2400 Å), the coating of FIG. 7 and drying of FIG. 8 may be repeated as required to achieve the desired final film thickness gradually instead of obtaining it in one application.

Figure 10:
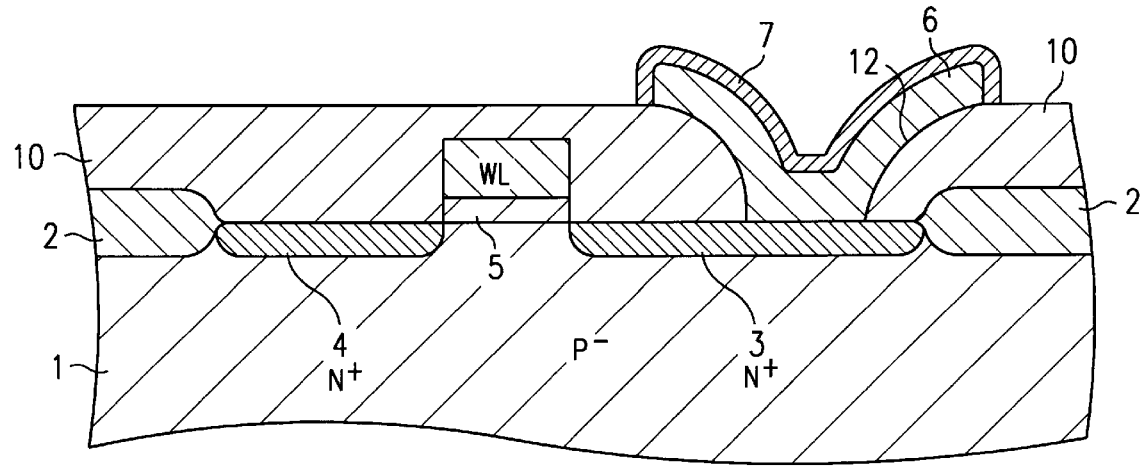
FIG. 10 is an enlarged cross-sectional view showing another stage of the process for the production of the memory cell of FIGS. 3 and 4.

Subsequently, as shown in FIG. 10, the unnecessary portion of the ferroelectric material film 7 formed over the whole surface is removed by the dry etching method, forming a required pattern of the PZT ferroelectric material film 7 over the lower electrode 6.

Figure 11:
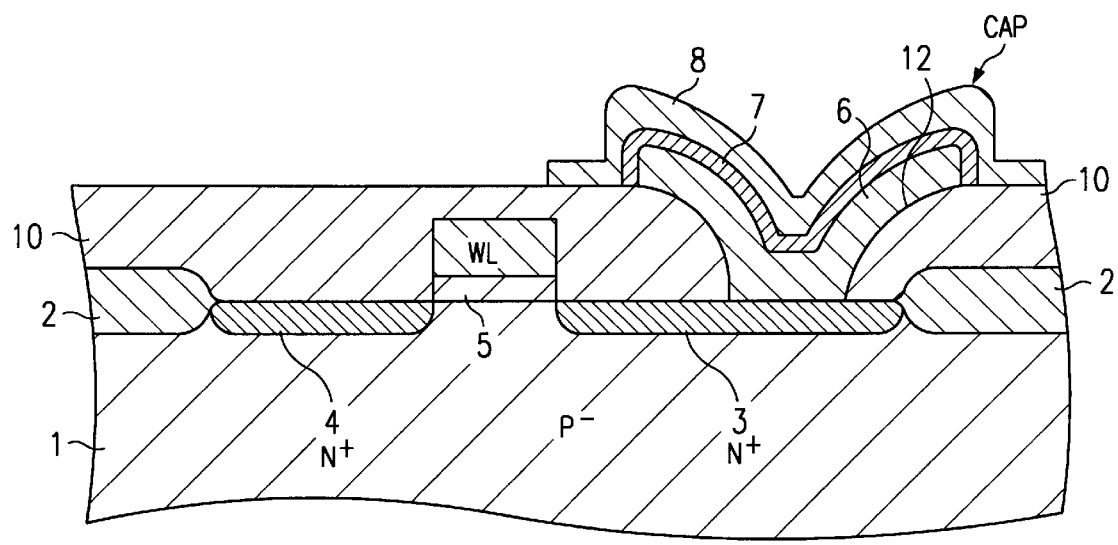
FIG. 11 is an enlarged cross-sectional view showing still another stage of the process for the production of the memory cell of FIGS. 3 and 4.

Subsequently, as shown in FIG. 11, an upper electrode 8 made of aluminum, platinum, etc., is formed in a required pattern on contact portions with the ferroelectric material film 7 by photolithography.

A memory cell is formed as described above. In this case, the oxidative sintering temperature for the PZT ferroelectric material film 7 can be advantageously set at 450°–700° C., especially at a low temperature of about 450° C.

Since the oxidative sintering temperature can be set at a low level, the risk of oxidation of the metal electrode 6 and circuit can be reduced, allowing their electrical characteristics to be maintained at satisfactory levels.

One embodiment of this invention has been explained as described above, but such an embodiment can be further modified in various ways based on the technical ideas of this invention.

For example, as a stabilizer component of the sol-gel raw material solution described above, alkanolamines such as dipropanolamine, triethanolamine, etc., and/or β-diketones such as acetylacetone, etc., in addition to DEA are also usable.

Furthermore, in addition to lead acetate, a lead fatty acid such as lead 2-ethylhexanoate, lead naphthenate, etc., lead alkoxides such as lead di-n-butoxide, lead di-n-pentoxide, etc., are also usable.

In addition to titanium isopropoxide, titanium alkoxides such as titanium tetra-n-butoxide, titanium tetra-n-pentoxide, etc., titanium fatty acid salts such as titanium 2-ethylhexanoate, titanium naphthenate, etc., are also usable.

In addition to zirconium isopropoxide, zirconium alkoxides such as zirconium tetra-n-butoxide, zirconium tetra-n-pentoxide, etc., and zirconium fatty acid salts such as zirconium ethylhexanoate, zirconium naphthenate, etc., are also usable.

As a solvent of the raw material solution, isopropanol, n-butanol, etc., in addition to methoxyethanol, are also usable.

The composition of the ferroelectric material film of this invention may be changed in various ways. Furthermore, its applications are not necessarily limited to the stack-type capacitor described above, but also the same stack-type capacitor as the above formed on a $SiO_2$ film with a lower electrode of this capacitor extended to connect to the source region of a transfer gate. Alternatively, it is also applicable to a capacitor not of the stack type but that with a capacitor incorporated in a so-called trench (groove).

As described above, with the mole ratio of the concentration of the alkanolamine such as DEA, etc., in the raw material solution of this invention being set at a relatively high level, specifically (alkanolamine/total metal atom)>3, it is possible to prepare a ferroelectric material film of $Pb(Zr, Ti)O_2$ with a perovskite crystalline structure even if the oxidative sintering is carried out at a relatively low temperature of about 450° C.

Therefore, if the $Pb(Zr,Ti)O_2$ thin film is used in a capacitor, etc., of semiconductor devices, the risk of oxidation of metal electrodes and other circuits is reduced, allowing the maintenance of their electrical characteristics at satisfactory levels.

We claim:

1. A method of forming a film of ferroelectric material with a perovskite crystalline structure by the sol-gel technique, said method comprising:

preparing a raw material solution containing an organometallic compound of a metallic element from which the film of ferroelectric material is to be formed, and a stabilizer taken from one or a combination of substances of the group including an alkanolamine and a β-diketone, wherein the concentration of the stabilizer has a mole ratio to the total metal atoms of (stabilizer/total metal atoms)>3;

providing a coating of the raw material solution on a substrate;

drying the coating of the raw material solution to form a dried gel film; and oxidative sintering the dried gel film at a temperature in the range of substantially 450° up to 550° C. to form a film of ferroelectric material having a perovskite crystalline structure.

2. A method as set forth in claim 1, in which the concentration mole ratio of the stabilizer in the raw material solution is in a mole ratio range of (stabilizer/total metal atoms)4–10.

3. A method as set forth in claim 1, wherein the raw material solution contains a lead fatty acid, titanium alkoxide, and zirconium alkoxide as organometallic compounds of respective metallic elements from which the film of ferroelectric material is to be formed.

4. A method as set forth in claim 3, wherein the stabilizer included in the raw material solution is diethanolamine.

5. A method as set forth in claim 3, wherein the stabilizer included in the raw material solution is acetylacetone.

6. A method as set forth in claim 3, wherein the stabilizer included in the raw material solution is a combination of diethanolamine and acetylacetone.

7. A process for producing a capacitor having a film of ferroelectric material as a dielectric between upper and lower electrodes of electrically conductive material, said process comprising:

preparing a raw material solution containing an organometallic compound of a metallic element from which the film of ferroelectric material is to be formed, and a stabilizer taken from one or a combination of substances of the group including an alkanolamine and a β-diketone, wherein the concentration of the stabilizer has a mole ratio to the total metal atoms of (stabilizer/total metal atoms)>3;

providing a coating of the raw material solution on an electrically conductive substrate which is to serve as the lower electrode of the capacitor;

drying the coating of the raw material solution to form a dried gel film;

oxidatively sintering the dried gel film at a temperature in the range of substantially 450° up to 550° C.;

forming a film of ferroelectric material having a perovskite crystalline structure on the electrically conductive substrate which is to serve as the lower electrode of the capacitor in response to the oxidative sintering of the dried gel film at a temperature in the range of 450° up to 550° C.;

patterning the film of ferroelectric material having the perovskite crystalline structure to remove unnecessary portions of the film of ferroelectric material having the perovskite crystalline structure from the electrically conductive substrate which is to serve as the lower electrode of the capacitor; and forming an upper electrode of electrically conductive material over the patterned film of ferroelectric material having the perovskite crystalline structure.

8. A process for producing a capacitor as set forth in claim 7, wherein the oxidative sintering of the dried gel film is carried out at a temperature of the order of 450° C.

9. A process as set forth in claim 7, wherein the capacitor is provided for a semiconductor memory device.

* * * * *